United States Patent
McConnell et al.

(10) Patent No.: US 6,678,646 B1
(45) Date of Patent: Jan. 13, 2004

(54) METHOD FOR IMPLEMENTING A PHYSICAL DESIGN FOR A DYNAMICALLY RECONFIGURABLE LOGIC CIRCUIT

(75) Inventors: David A. McConnell, Alameda, CA (US); Ajithkumar V. Dasari, Santa Clara, CA (US); Martin T. Mason, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 09/460,069

(22) Filed: Dec. 14, 1999

(51) Int. Cl.$^7$ .............................................. G06F 17/50
(52) U.S. Cl. .............................. 703/22; 703/24; 703/25; 716/5; 716/7; 716/8
(58) Field of Search .............................. 703/22, 23, 24, 703/25, 14; 716/1, 5, 7, 8

(56) References Cited

U.S. PATENT DOCUMENTS

| | | | | |
|---|---|---|---|---|
| 5,781,756 A | | 7/1998 | Hung .......................... | 395/430 |
| 5,850,537 A | * | 12/1998 | Selvidge et al. ............ | 395/500 |
| 5,870,309 A | * | 2/1999 | Lawman ..................... | 364/489 |
| 6,292,764 B1 | * | 9/2001 | Avery et al. .................. | 703/14 |
| 6,457,164 B1 | * | 9/2002 | Hwang et al. ................. | 716/8 |

OTHER PUBLICATIONS

Conference paper by Steven A. Guccione et al. entitled "Run–Time Parameterizable Cores", Aug. 30, 1999, pp. 215–222, XP–008002094, ISSN 0302–9743.

Conference paper by James Hwang et al. entitled "Generating Layouts for Self–Implementing Modules", Aug. 31, 1998, pp. 525–529, XP–002103590.

A conference paper entitled "Automating Production of Run–Time Reconfigurable Designs" by Nabeel Shirazi, Wayne Luk, and Peter Y.K. Cheung.

* cited by examiner

Primary Examiner—Krisna Lim
Assistant Examiner—Thai Phan
(74) Attorney, Agent, or Firm—Thomas Schneck

(57) ABSTRACT

A method for implementing the physical design for a dynamically reconfigurable logic circuit. The method is carried out using software that forms a physical design flow to take a design specification from a schematic or high-level description language (HDL) through to FPGA configuration bitstream files.

The method involves reading a design netlist that was entered, the design netlist including a set of static macros and a set of reconfigurable macro contexts. Then, each of the reconfigurable macros are compiled and an initial device context is placed and routed. The device context is updated by arbitrarily selecting a context for each reconfigurable macro, placing and routing the updated device context and repeating the steps of updating, placing and routing until all of the reconfigurable macro contexts have been placed and routed. Then, after the compilation process is complete, full, partial, and incremental bitstream files are generated.

13 Claims, 6 Drawing Sheets

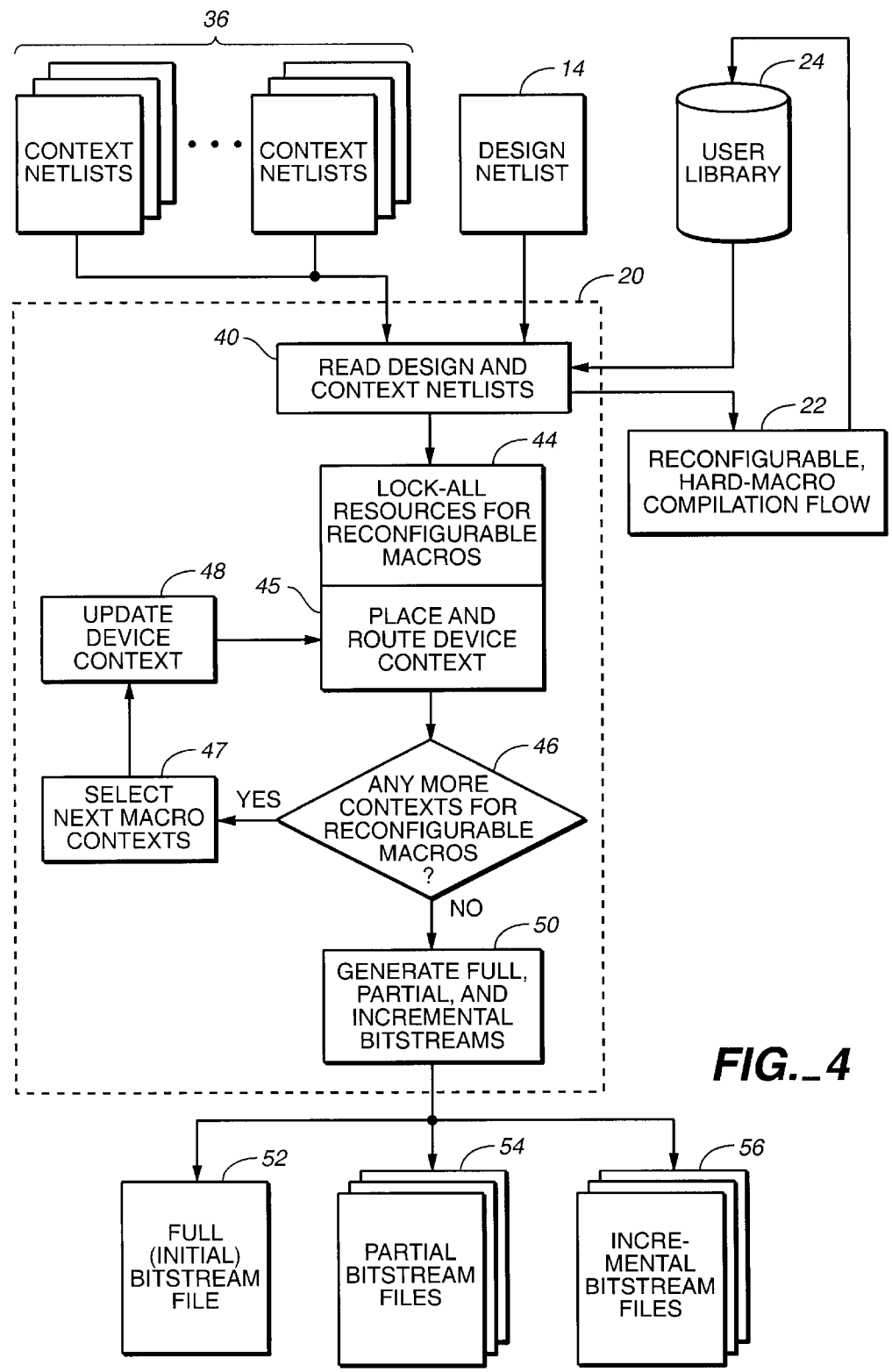
FIG._4

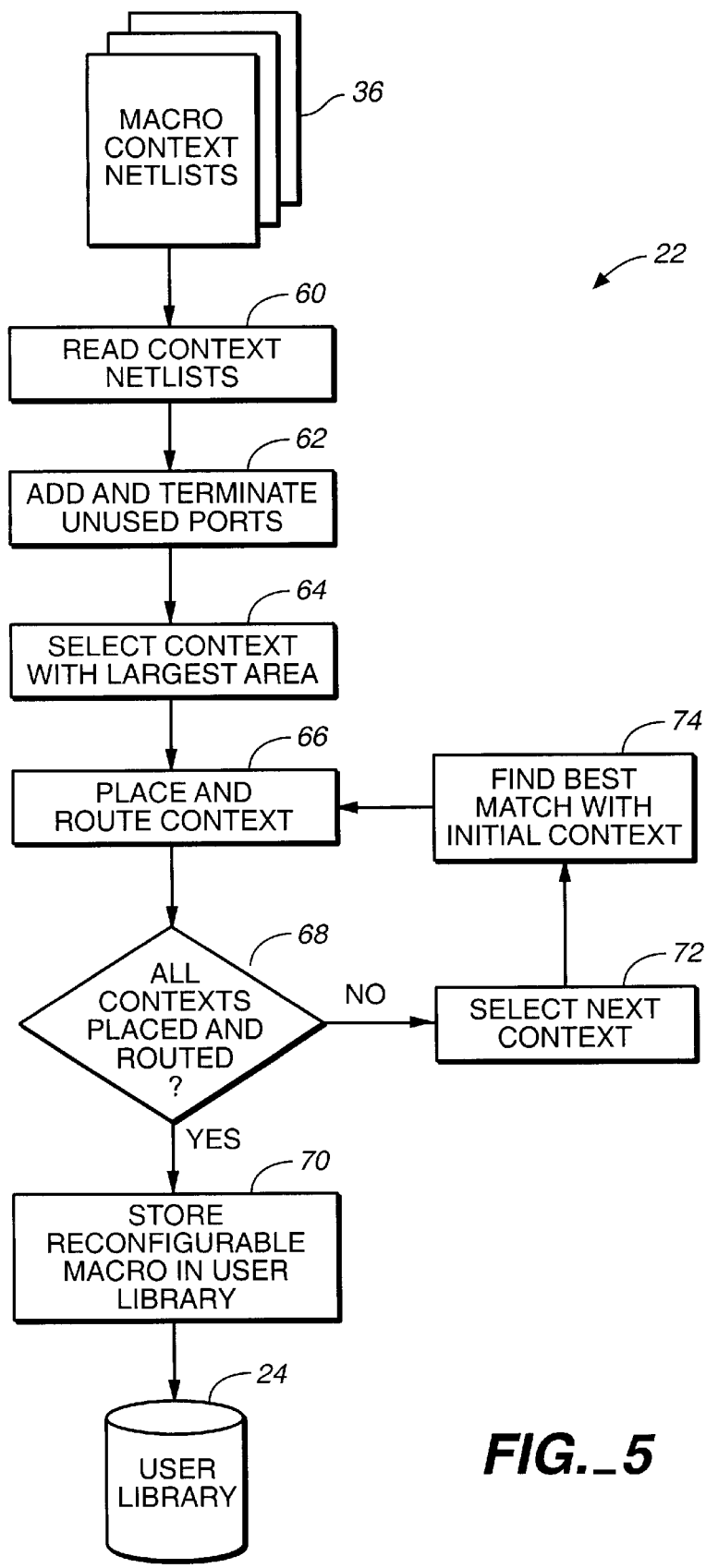
FIG._5

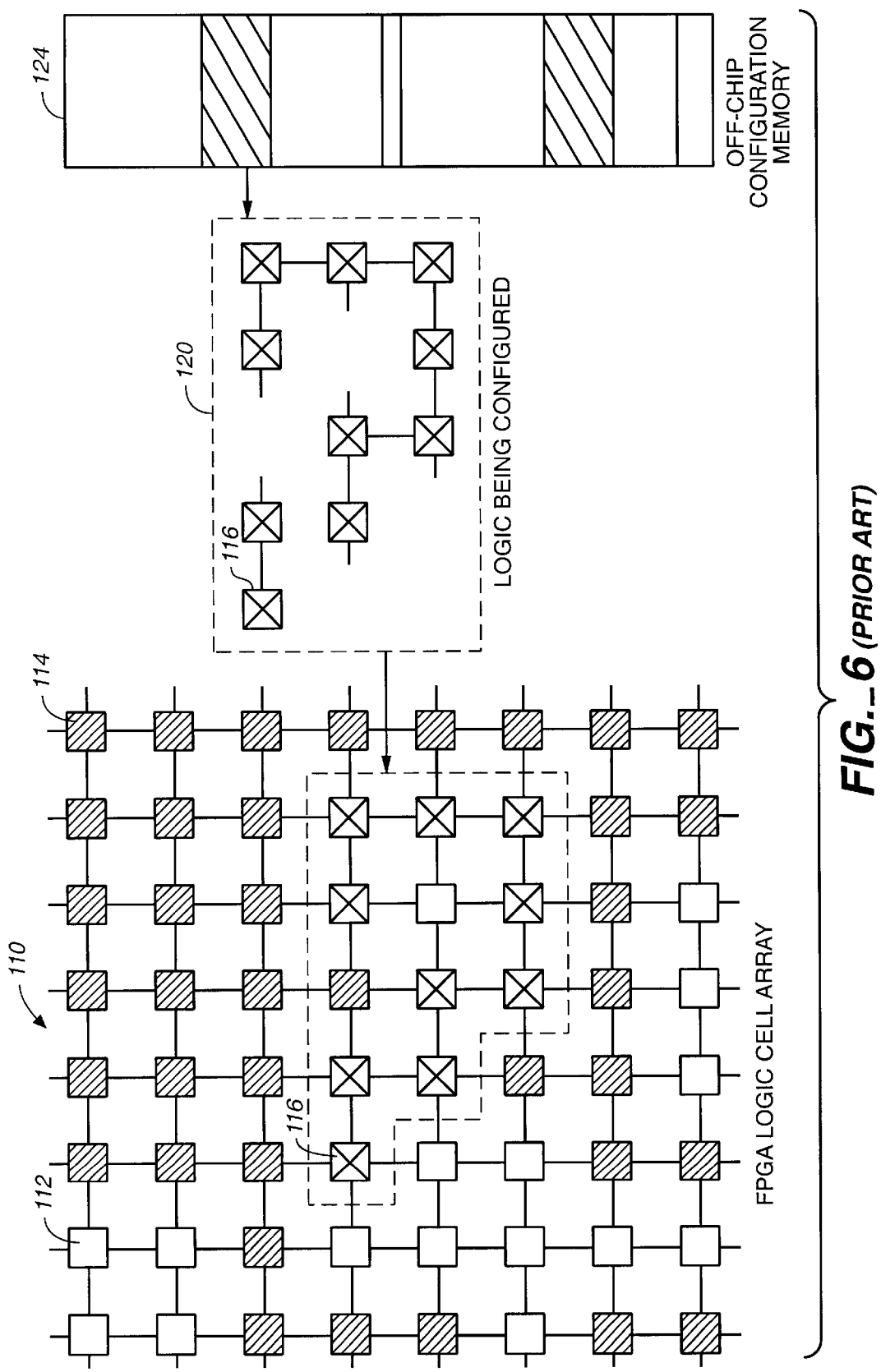
FIG._6 *(PRIOR ART)*

METHOD FOR IMPLEMENTING A PHYSICAL DESIGN FOR A DYNAMICALLY RECONFIGURABLE LOGIC CIRCUIT

TECHNICAL FIELD

The present invention relates generally to programmable logic devices formed on integrated circuits, and more specifically to a method of implementing a physical design for a dynamically reconfigurable logic circuit.

BACKGROUND ART

Dynamically reconfigurable logic, also known as Cache Logic, is a digital design technique for reconfiguring programmable logic circuits such as SRAM-based Field Programmable Gate Arrays (FPGAs) and Complex Programmable Logic Devices (CPLDs). Dynamically reconfigurable logic exploits the dynamic and partial reconfigurability of SRAM-based FPGA's by reconfiguring part of the FPGA logic while the remainder of the logic continues to operate uninterrupted.

The concept of dynamically reconfigurable logic is illustrated in FIG. 6, which shows reconfiguration of a portion of the logic implemented on an FPGA. The replacement logic 120 is stored in an off-chip memory 124. During reconfiguration, only that portion of the logic to be replaced, reconfigurable logic 116, is overwritten. All other logic, static logic 114 and unused logic 112, is unaffected and continues normal operation. The configuration bitstream size is minimized since only a portion of the FPGA is reconfigured.

Consequently, both the time taken to reconfigure the FPGA, called the reconfiguration latency, and the off-chip storage size are minimized. This contrasts with traditional FPGA design that results in a fixed-logic implementation of a circuit that does not change at run-time.

Since FPGA resources are shared between a number of different implementations of a logic circuit, Dynamically Reconfigurable Logic provides designers with important benefits. Less FPGA resources are used than would result from a fixed-logic design. This can be exploited to pack more logic into a given FPGA or to use fewer or smaller, less-expensive FPGAs than would otherwise be possible. Consequently, cost, board-area and power consumption can all be reduced. In addition, in a system-wide context, Dynamically Reconfigurable Logic provides a level of run-time flexibility normally associated with microprocessors together with operating speeds and fine-grain parallelism approaching those of custom hardware. This benefit has been exploited by reconfigurable computing applications that use FPGAs to implement application-specific, custom co-processors whose function can be changed at run-time.

Commercially available Computer Aided Design (CAD) tools provide a good solution for traditional, fixed-logic FPGA design. A designer can specify the logic, perform functional simulation, create a physical layout, perform post-layout simulation, and generate an FPGA configuration bitstream. The result of this is that the designer can proceed to the prototype stage with a high degree of confidence in the FPGA design. As part of this process, automatic FPGA compilation (floorplanning, placement and routing) methods provide fast design turn-around and the designer need not be concerned with the details of the target FPGA architecture or have expert-knowledge of the FPGA manual place and route methods.

For Dynamically Reconfigurable Logic design existing, commercial, physical design methods have serious limitations. In order to use these methods, a designer must develop each different context of the FPGA logic independently, as a fixed-logic design. The incremental design change capability provided by most FPGA vendors can be of assistance in this process by allowing designers to make changes in the physical layout without altering the placement and routing of static logic. For designs that have many possible variants for sections of logic, this procedure is extremely time consuming and difficult to manage. Furthermore, floorplanning, placement and routing of design changes must be performed manually to ensure that the same FPGA resources are used by different contexts. This requires that the designer be thoroughly intimate with the details of the target FPGA architecture and is an expert-user of the physical design methods.

For early practitioners of new technology, the limitations of the present physical design methods may be tolerable. However, for the majority of designers, who have time-to-market pressures and may not possess detailed knowledge of FPGA architectures and methods, the present physical design methods are not acceptable. In order to address this problem, it is necessary to integrate design methodology into the existing FPGA design flow as transparently as possible, to address the verification of the behavior of a Dynamically Reconfigurable Logic design, and to provide automation of the physical design process.

Prior attempts to solve this problem include U.S. Pat. No. 5,781,756 to Hung which discloses a dynamically and partially reconfigurable FPGA which allows run-time reconfiguration without having to rewrite entirely the configuration memory cells. The '756 patent also discloses a method for dynamically and partially reconfiguring the FPGA configuration without having to rewrite entirely the configuration cells. A memory configuration device is included in the FPGA for controlling the loading of the data register and address register of the FPGA. This device allows the skip over of unchanged configuration memory cells. Therefore, only the configuration cells that need to be changed will be rewritten.

A conference paper entitled "Automating Production of Run-Time Reconfigurable Designs" by Nabeel Shirazi, Wayne Luk, and Peter Y. K. Cheung discloses the matching of two successive circuit configurations to locate the components common to them, so that reconfiguration time can be minimized. The matching procedure contains three steps: 1) Representing the components in the two successive circuits as nodes in a bipartite graph; 2) computing the best match for each node in one configuration with a node in the other configuration, taking into account the values of the weights; 3) inserting RC-Mux and RC_Dmux to produce a combined circuit with explicit reconfigurable regions. However, in the overall design process, this matching occurs before the physical design process.

It is the object of the present invention to provide designers with a method for implementing the physical design for a dynamically reconfigurable logic circuit that provides a level of automation enjoyed in traditional, fixed-logic design.

It is a further object of the invention to provide a method of implementing a physical design that ensures that the implementation of the design is correct, that does not violate any electrical rules in the target device, and will protect against run-time contention for FPGA resources.

SUMMARY OF THE INVENTION

The above objects have been achieved by a method for implementing the manual and automatic physical design of dynamically reconfigurable logic applications. The method is carried out using software that forms a physical design flow to take a design specification from a schematic or high-level description language (HDL) through to FPGA configuration bitstream files. The method involves reading a design net list that includes a set of static macros and a set of reconfigurable macro contexts, compiling each of the reconfigurable macros, placing and routing an initial device context containing the set of static macros and the initial macro context for each of the reconfigurable macros, updating the device context by arbitrarily selecting a context for each reconfigurable macro, placing and routing the updated device context and repeating the updating and placing steps until all of the reconfigurable macro contexts have been placed and routed. Then, after the compilation process is complete, full, partial and incremental bitstreams are generated.

The method of the present invention frees designers from FPGA-specific considerations and allows them to focus on system level issues. No expert level knowledge of dynamic reconfigurable logic implementation or FPGA architecture is required to use the present invention, as the invention uses industry-standard design entry formats. Since many of the key design steps can be automatic, valuable time can be saved by eliminating the need to manually conduct the processes of floorplanning, placement, and routing. The method of the present invention provides designers with a straightforward path from Dynamically Reconfigurable Logic concept to FPGA implementation.

BRIEF DESCRIPTION OF THE DRAWINGS

FIG. 4 is a block diagram of the Dynamically Reconfigurable Logic Design Flow method used in the Physical Design Process of FIG. 3.

FIG. 5 is a block diagram of the Reconfigurable Hard-Macro compilation flow method used in the Physical Design Process of FIG. 3.

FIG. 6 is a block diagram of the Dynamic Reconfigurable Logic concept as known in the prior art.

BEST MODE FOR CARRYING OUT THE INVENTION

Figure 1:
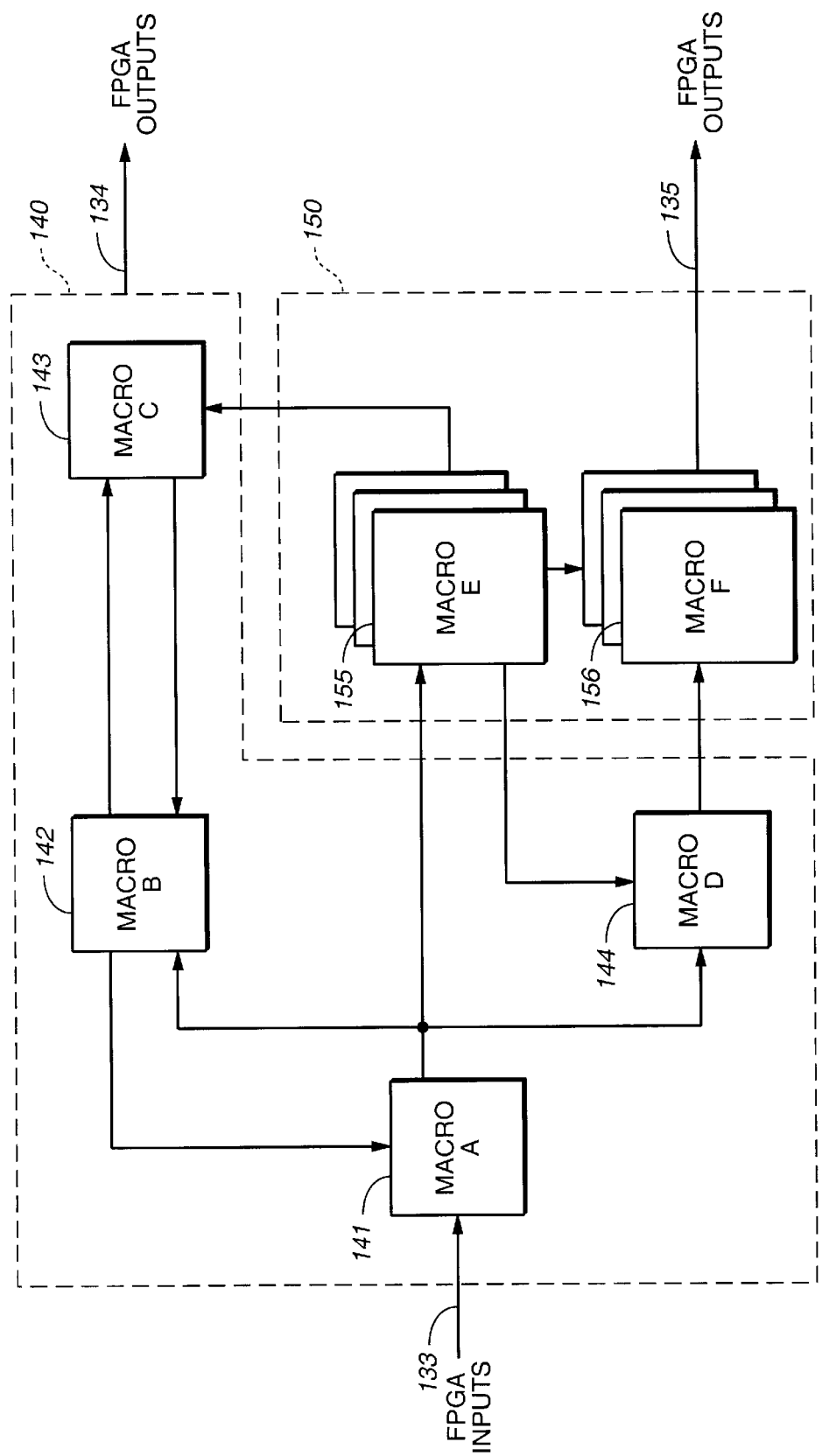
FIG. 1 is a block diagram of the Dynamically Reconfigurable Logic design specification used in the method of the present invention.

With reference to FIG. 1, a Dynamically Reconfigurable Logic Design for using reconfigurable macros is shown to include static logic 140 and reconfiigurable logic 150. Each of the static 140 and reconfigurable 150 logic circuits consists of a network of circuit macros. Each macro is a circuit element that represents a basic logic resource in the target FPGA architecture, such as a logic gate or a storage element. Alternatively circuit macros may be hierarchical, containing other hierarchical macros or circuit elements or both. Macro A 141, macro B 142, macro C 143, and macro D 144 make up a network of static macros, while macro E 155 and macro F 156 make up a network of reconfigurable macros. FPGA input 133 is shown to be supplied to macro A 141 of the static logic network. FPGA output 134 is produced from macro C 143 of the static logic, while FPGA output 135 is produced from macro F 156 of the reconfigurable logic. The macros are interconnected within the Dynamically Reconfigurable Logic Design.

In a Dynamically Reconfigurable Logic Design, a reconfigurable macro is additionally defined. Associated with each reconfigurable macro are one or more macro contexts, or configurations. Each macro context is defined as a network of circuit macros. Macro contexts represent and define the different circuit configurations that a reconfigurable macro may implement. The set of macro contexts associated with a reconfigurable macro share the same FPGA resources. Consequently, only one macro context can be active on the FPGA at any instant in time. The macros that are not reconfigurable are called static macros since they permanently reside on the FPGA during run time. The implementation of a design containing static macros and a particular context for each reconfigurable macro is called a device context. Each device context is defined by the static logic in the design and the selection of a particular macro context for each reconfigurable macro. Reconfigurable macros have multiple functional contexts while static macros have a single functional context. While static macros contain a fixed logic network, reconfigurable macros do not. Instead each reconfigurable macro is defined by a set of macro contexts. Within the overall FPGA design, there may be a number of different reconfigurable macros, and the different macros can have their contexts switched independently of each other. The design flow for these reconfigurable macros does not preclude any particular sequence of contexts at run time.

At run time, partial and dynamic reconfiguration of the FPGA is typically controlled by an external, off-chip microprocessor, off-chip logic, or logic incorporated into the static part of the FPGA logic. In practice, a designer would incorporate logic into the static part of the design that would detect when reconfiguration is appropriate. When the application is operational, in system, this logic would signal to an external, off-chip microprocessor (or off-chip logic) that a particular macro needs to have its current context switched to some other context. The off-chip microprocessor (or off-chip logic) is responsible for downloading the appropriate partial or incremental bitstreams to the FPGA. However, the physical design tools do not need to know anything about this in order to create the physical layout of the static logic and reconfigurable macros. All the physical tools need to know is which design-entry netlists constitute the set of contexts for each reconfigurable macro. The resulting physical layouts do not restrict the sequence of contexts that can be implemented during system operation or the conditions under which context switching can occur.

Figure 2:
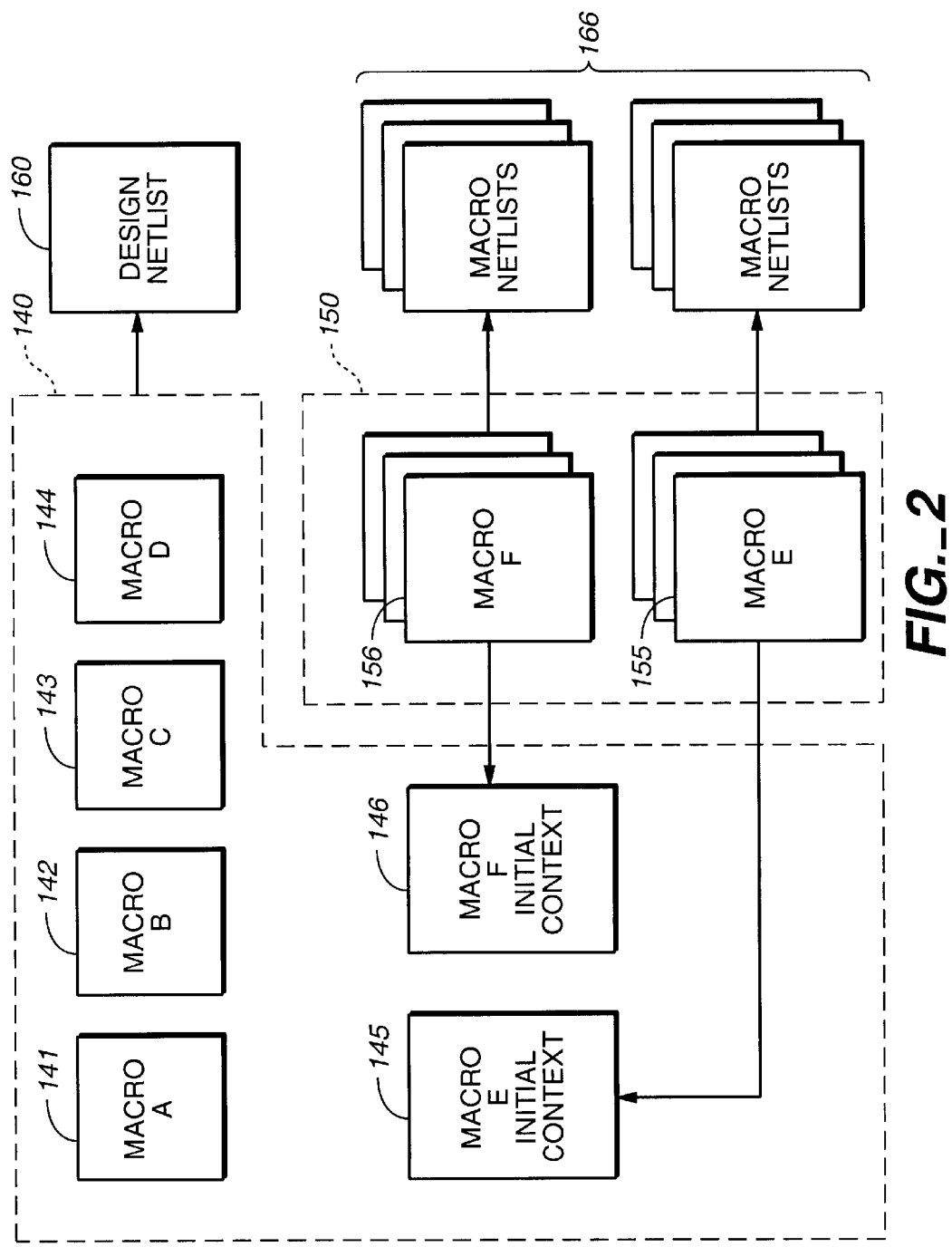
FIG. 2 is a block diagram of the Dynamically Reconfigurable Logic design specification of FIG. 1 employing Design Netlists used in the method of the present invention.

A Dynamically Reconfigurable Logic Design can be specified using industry-standard design entry formats such as VHDL, Verilog, or Schematic Capture. The reconfigurable logic in the design is described by a set of independent netlists for each context of each reconfigurable macro. The initial device context is described as a netlist that includes all of the static logic in the design, and the initial context to be used for each configurable macro. With reference to FIG. 2, the initial context netlist or design netlist 160 includes the network of static macros 140 and an initial context macro for each of the reconfigurable macros, macro E 155 and macro F 156. The reconfigurable macros are each defined by a set of macro netlists 166, each of which define a particular macro context.

Figure 3:
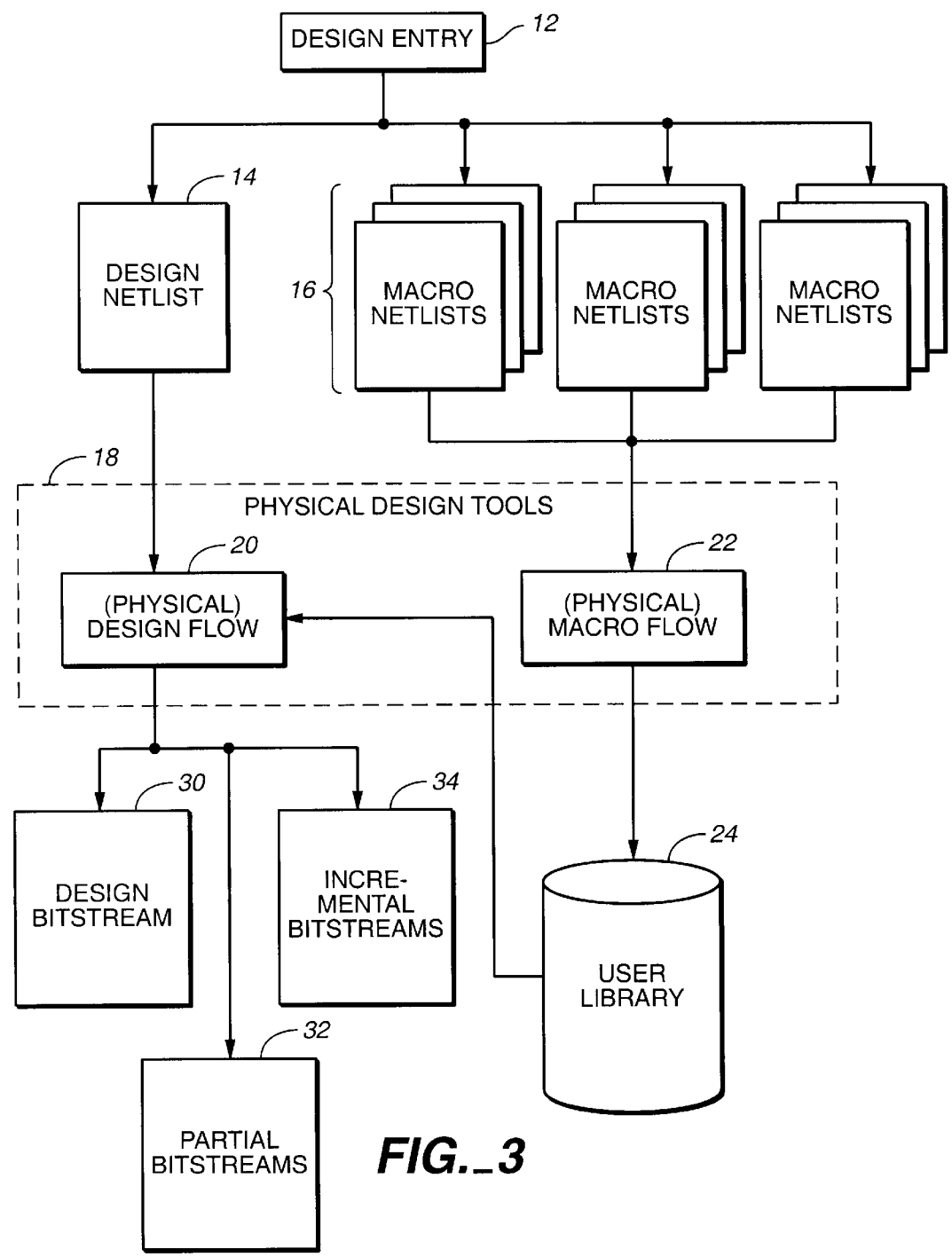
FIG. 3 is a block diagram of the Dynamically Reconfigurable Logic Physical Design Process of the present invention.

With reference to FIG. 3, the Physical Design Process of the present invention is shown. As explained above, the design entry step 12 is entered using any industry-standard design entry format. A design entry specifies the design netlist 14 and the macro netlists 16 for each of the reconfigurable macros. The design netlist 14 and the macro netlists 16 are supplied as inputs to the FPGA physical design tools 18. The physical design tools 18 are used for the compilation of both the static and reconfigurable logic in the design. Within the physical design tools framework, the key step of compilation, including floor planning, placement and routing, can be performed manually or automatically. It is in the physical design tool function of this process in which the method of the present invention is implemented. Automation of the compilation process means that the designer is relieved of the requirement for detailed knowledge of FPGA architectures and tools. Automation also enables fast design turnaround and ensures that the electrical design rules for the target architecture are not violated and also protects against run-time contention for FPGA resources. The physical tools include the capability to generate configuration, and reconfiguration, bitstreams for both static and reconfigurable logic within the design.

In FIG. 3 there are two different software tool flows which constitute the present invention. One software tool flow is for the creation of reconfigurable hard macros, designated macro flow 22, and a software flow for the creation of the complete cache logic designs, designated design flow 20. The concept of a reconfigurable hard macro is similar to that of a static logic hard macro in a fixed logic design in that both types of hard macro containmplacement and routing information for a target FPGA architecture. However, the reconfigurable hard macro is different in that it has multiple contexts, each of which is a particular implementation of the reconfigurable macro context on the target architecture. While reconfigurable macros have different functional contexts, reconfigurable hard macros have different functional and structural contexts. The macro flow 22 and the design flow 20 can be used independently. Alternatively, the macro flow 22 can be used implicitly in the design flow 20 by supplying the macro context netlists together with the design netlist, in which case the creation of reconfigurable hard macros will be performed automatically, as part of the Dynamically Reconfigurable Logic Design flow. A user library 24 is used to store the reconfigurable hard macros after they have been compiled.

The end result of the design process shown in FIG. 3 is a collection of configuration and reconfiguration bitstream files. Three different types of bitstream files are generated. The design bitstream 30 is a full configuration bitstream for the target FPGA. The design bitstream 30 includes the static logic in the design and the initial context for each reconfigurable macro. The design bitstream 30 is used as the initial configuration for the FPGA on power up or system re-set. The second type of bitstream is called a partial bitstream 32. One partial bitstream 32 is generated for each reconfigurable macro context in the cache logic design. Partial bitstreams contain only the configuration data relating to a particular macro context and the interconnection of that context to static logic and the contexts of other, separate, reconfigurable macros. Partial bitstreams 32 are organized so that they can be applied to the target FPGA irrespective of the macro context that has proceeded it. The third type of configuration bitstream generated is called an incremental reconfiguration bitstream 34. Incremental reconfiguration bitstreams 34 contain the configuration data needed to transform one particular context into another within a particular reconfigurable macro.

FIG. 3 does not show the simulation steps that are normally performed as part of the FPGA design process. For a fixed logic design, pre-layout simulation is performed before proceeding to the physical design step 18. Post layout simulation is performed once the design has been placed and routed. In the Dynamically Reconfigurable Logic Design Flow described here, simulation can be used to independently verify each device context for a FPGA.

The software design flow 20 for creating the complete Dynamically Reconfigurable Logic Design is shown in FIG. 4. The design flow process 20 begins with the step 40 of reading the design netlist. Any macros in the design netlist 14 that correspond to a reconfigurable hard macro context will have been previously compiled and stored in the user library 24 by the macro flow process, which will be later described with reference to FIG. 5. The macros in the design netlist 14 that correspond to reconfigurable hard macro context are designated as context netlists 36 and will also be read from the user library during this step. In addition, under user direction, macros in the design netlist 14 can be associated with reconfigurable macros that do not yet contain any placement or routing information. These reconfigurable macros that do not yet contain any placement or routing information are known as reconfigurable soft macros.

Once the design netlist 14 and all of the context netlists 36 have been read, the next step in the compilation process is to create reconfigurable hard macros for the particular reconfigurable soft macros specified by the user. With reference to FIG. 5, the software tool flow for creating a reconfigurable hard macro is shown. This method of creating a reconfigurable hard macro 22 is used prior to the design flow 20 and is also used after the step 40 of reading the design netlists in order to charge reconfigurable soft macros into reconfigurable hard macros. The macro flow process 22 begins with the step 60 of reading the set of macro context netlists 36, under the direction of the user, that will form the reconfigurable hard macro. Once all of the context netlists 36 have been read, a pre-processing step 62 modifies each context netlist to ensure that each context has the same input and output ports. Generally, this means that input and output ports are added to context netlists in order that each context has the same input and output connections when included within a particular device context. The next step 64 in the compilation process is to find the macro context that will require the most FPGA resources to implement. The size of this context, when placed and routed, will define a bounding box within which all other contexts will be placed and routed. Once the largest context has been selected, the next step 6.6 is to place and route the largest context on the FPGA. The placement and routing of all other contexts is an iterative procedure comprising the steps of calculating a placement match between the context and the initial context, and placing and routing that context on the FPGA. For each context, the matching algorithm will first seek to place components with I/O ports on the same location as I/O components in the initial context. In doing so, the I/O ports on different contexts reside at roughly the same locations on the FPGA. Once the I/O port components have been placed, the next step is to find the best structural match between the remaining components and the initial context. By matching function and structure, the size and consequently the reconfiguration latency of incremental bitstreams will be minimized. This process of determining whether all the context are placed and routed 68, selecting the next context if there are any remaining contexts 72, finding the best match for the initial context 74, and placing and routing the context 66, continues until all of the contexts have been placed and routed. Once all of the contexts have been placed and routed, the reconfiguration hard macro has been compiled and is stored 70 in user library 24 for use in the dynamically reconfiigurable logic designs.

Referring back to FIG. 4, after the step of compiling the reconfigurable soft macros into reconfigurable hard macros 22, the next step is to lock all the resources for the reconfigurable macros 44 and then to place and route the initial device context containing the initial contexts of reconfigurable macros 45. For a reconfigurable hard macro, the placement and routing information for all contexts is used to determine what resources (e.g., bus segments, routing switches, core cell or portions of core cells, etc.) relative to the placement of the initial context, are to be locked off, or reserved, from use by static logic. This ensures that there will not be any contention for FPGA resources between static logic and reconfigurable logic. Blocking of resources occurs the first time a reconfigurable macro context is placed and may require that static logic, that has already been placed, be moved from reserved FPGA resources. Since only the detailed resources used by the context of a reconfigurable macro are locked from use by static logic, optimal use of FPGA resources can be achieved in the placement and routing of static logic. There is no requirement for all resources within the overall bounding box of a reconfigurable hard macro to be locked off. Consequently, reconfigurable hard macros can have irregular shapes and can be interspersed with static logic macros and routing.

Once placement and routing of the initial device context is complete, the placement locations on the FPGA for all contexts of all reconfigurable macros are defined implicitly (i.e., each context of a reconfigurable macro will be placed at the same location as the initial context of that macro). In addition, the placement and routing of static logic is also defined for all device contexts, since it does not change between contexts. However, the user can intervene at this point and modify the placement and routing of static and reconfigurable logic manually. Any changes made to placement of a reconfigurable macro context will cause the placement of all other context of that macro to shift to the same location. Since the I/O port connections on a reconfigurable macro may or may not be at the same location on the FPGA for all contexts, each context may have different physical routing connecting it to static logic macros. Consequently, each context placement of a reconfigurable macro has associated physical routing for connection to other static macros within a device context. For connections between different reconfigurable macros, care is taken to ensure that the same physical routing is used, regardless of the particular contexts that are connected.

The compilation process continues by the iterative process of updating the device context and compiling. To update the device context, a context is selected arbitrarily for each reconfigurable macro. The previous context for reconfigurable macros are then replaced 48, at the same FPGA location, by the newly selected contexts. The static logic in the design remains placed and routed, however, the physical routing between reconfigurable macros and other macros is removed and is stored with the previous macro contexts. Consequently, compilation of the updated device context involves only the physical routing of connections between the new context macros and other macros in the device context. The number of iterations required to complete compilation of the dynamically reconfigurable logic design, including the initial device context, is equal to the number of contexts in the reconfigurable macro with the largest number of contexts. The process continues until all of the contexts have been selected, updated and placed and routed.

Finally, after the compilation process is complete, the software automatically, or under user direction, generates the full, partial, and incremental bitstreams.

What is claimed is:

1. A method for implementing a physical design for a dynamically reconfigurable logic circuit, comprising:

reading a design netlist that includes a set of static macros and a set of reconfigurable macro contexts, reading each of a plurality of reconfigurable macros, each of the reconfigurable macros corresponding to one of the set of reconfigurable macro contexts in the design netlist, placing and routing an initial device context on a location on the logic circuit, the initial device context containing the initial macro context for the set of static macros and for each of the plurality of reconfigurable macros, determining whether all of the reconfigurable macro contexts have been placed and routed, selecting a next reconfigurable macro context if all of the reconfigurable macro contexts have not been placed and routed, updating the device context based on the newly selected macro context by arbitrarily selecting reconfigurable macro context for each reconfigurable macro, placing and routing the updated device context on the logic circuit at the same location, repeating the steps of determining, selecting, updating and placing and routing until all of the reconfigurable macro contexts have been placed and routed, and generating a set of bitstreams for the logic circuit.

2. A method for implementing a physical design for a dynamically reconfigurable logic circuit, as in claim 1, further comprising the steps of:

compiling each of a plurality of reconfigurable macros prior to reading the design netlist, and storing the reconfigurable macros in a user library.

3. A method for implementing a physical design for a dynamically reconfigurable logic circuit, as in claim 2, wherein the steps of compiling each of the plurality of reconfigurable macros include:

reading a set of context netlists, the set of context netlists corresponding to a particular reconfigurable macro, modifying each context netlist in the set of context netlists so that each of a first set of contexts has a same set of input and output ports, selecting a largest context from the first set of contexts, placing and routing the largest context on the logic circuit, selecting a next context from the first set of contexts, calculating a placement match between the next context and the largest context, placing and routing the next context on the logic circuit, and repeating the steps of selecting and placing and routing for all of the contexts in the first set of contexts.

4. A method for implementing a physical design for a dynamically reconfigurable logic circuit, as in claim 3, wherein the plurality of reconfigurable macros includes reconfigurable hard macros and reconfigurable soft macros, the reconfigurable hard macros being compiled prior to reading the design netlist and the reconfigurable soft macros being compiled after reading the design netlist.

5. A method for implementing a physical design for a dynamically reconfigurable logic circuit, as in claim 1, wherein the set of bitstreams generated includes a first bitstream that includes a set of static logic and a set of initial contexts, each initial context corresponding to one of the plurality of reconfigurable macros.

6. A method for implementing a physical design for a dynamically reconfigurable logic circuit, as in claim 1, wherein the set of bitstreams generated includes a second bitstream that includes a set of configuration data relating to a particular macro context.

7. A method for implementing a physical design for a dynamically reconfigurable logic circuit, as in claim 1, wherein the set of bitstreams generated includes a third bitstream that includes a set of configuration data for transforming a first device context into a second device context.

8. A method for implementing a physical design for a dynamically reconfigurable logic circuit, comprising:
   compiling each of a plurality of reconfigurable hard macros,
   storing the reconfigurable hard macros in a user library,
   reading a design netlist that includes a set of static macros and a set of reconfigurable macro contexts, the set of reconfigurable macro contexts including an initial macro context corresponding to each of a plurality of reconfigurable macros, the plurality of reconfigurable macros including the plurality of reconfigurable hard macros,
   reading each of the reconfigurable macros from the user library, each of the reconfigurable macros corresponding to one of the set of reconfigurable macro contexts in the design netlist,
   placing and routing an initial device context on a location on the logic circuit, the initial device context containing the initial macro context for the set of static macros and for each of the plurality of reconfigurable macros,
   determining whether all of the reconfigurable macro contexts have been placed and routed,
   selecting a next reconfigurable macro context if all of the reconfigurable macro contexts have not been placed and routed,
   updating the device context based on the selected next macro context,
   placing and routing the updated device context on the logic circuit,
   repeating the steps of determining, selecting, updating and placing and routing until all of the reconfigurable macro contexts have been placed and routed,
   generating a first bitstream for the logic circuit, the first bitstream including a set of static logic and a set of initial contexts, each initial context corresponding to one of the plurality of reconfigurable macros,
   generating a second bitstream for the logic circuit, the second bitstream including a set of configuration data relating to a particular macro context, and
   generating a third bitstream for the logic circuit, the third bitstream including a set of configuration data for transforming a first device context into a second device context.

9. A method for implementing a physical design for a dynamically reconfigurable logic circuit, as in claim 8, wherein the steps of compiling each of the reconfigurable hard macros include:
   reading a set of context netlists, the set of context netlists corresponding to a particular reconfigurable hard macro,
   modifying each context netlist in the set of context netlists so that each of a first set of contexts has a same set of input and output ports,
   selecting a largest context from the first set of contexts,
   placing and routing the largest context on the logic circuit,
   selecting a next context from the first set of contexts,
   calculating a placement match between the next context and the largest context,
   placing and routing the next context on the logic circuit, and
   repeating the steps of selecting and placing and routing for all of the contexts in the first set of contexts.

10. A method for implementing a physical design for a dynamically reconfigurable logic circuit, as in claim 8, wherein the plurality of reconfigurable macros includes a plurality of reconfigurable soft macros, and further comprising, after the step of reading the design netlist,
   compiling each of the plurality of reconfigurable soft macros to create additional reconfigurable hard macros, and
   storing the additional reconfigurable hard macros in the user library.

11. A method for implementing a physical design for a dynamically reconfigurable logic circuit, as in claim 10, wherein the steps of compiling each of the reconfigurable soft macros include:
   reading a second set of context netlists, the second set of context netlists corresponding to a particular reconfigurable soft macro,
   modifying each context netlist in the second set of context netlists so that each of a second set of contexts has a same set of input and output ports,
   selecting a largest context from the second set of contexts,
   placing and routing the largest context on the logic circuit,
   selecting a next context from the second set of contexts,
   calculating a placement match between the next context and the largest context,
   placing and routing the next context on the logic circuit, and
   repeating the steps of selecting and placing and routing for all of the contexts in the second set of contexts.

12. A method for implementing a physical design for a dynamically reconfigurable logic circuit, as in claim 8, further comprising, after the step of placing and routing,
   manually modifying the location of placement and routing of the static macros and reconfigurable macros.

13. A method for implementing a physical design for a reconfigurable macro comprising:
   reading a set of context netlists, the set of context netlists corresponding to a particular reconfigurable macro from a plurality of reconfigurable macros,
   modifying each context netlist in the set of context netlists so that each of a first set of contexts has a same set of input and output ports,
   selecting a largest context from the first set of contexts,
   placing and routing the largest context on the logic circuit,
   selecting a next context from the first set of contexts,
   calculating a placement match between the next context and the largest context,
   placing and routing the next context on the logic circuit, and
   repeating the steps of selecting and placing and routing for all of the contexts in the first set of contexts.

* * * * *